United States Patent
Hsu et al.

(10) Patent No.: US 8,307,126 B2
(45) Date of Patent: Nov. 6, 2012

(54) OUTPUT PIN EXPANSION USING SHIFT REGISTER RECEIVING DATA BIT EACH SOFTWARE COUNTED CLOCK FOR PARALLEL OUTPUT STROBE

(75) Inventors: Yi-Chang Hsu, Taipei (TW); Chen-Kuo Huang, Taipei (TW); Ching-Feng Hsieh, Taipei (TW); Jen-Huan Yu, Taipei (TW)

(73) Assignee: Askey Computer Corporation, Taipei (TW)

( * ) Notice: Subject to any disclaimer, the term of this patent is extended or adjusted under 35 U.S.C. 154(b) by 678 days.

(21) Appl. No.: 12/434,139

(22) Filed: May 1, 2009

(65) Prior Publication Data

US 2010/0169697 A1 Jul. 1, 2010

(51) Int. Cl.
*G06F 3/00* (2006.01)
(52) U.S. Cl. .............................. 710/2; 710/71
(58) Field of Classification Search .................. None
See application file for complete search history.

(56) References Cited

U.S. PATENT DOCUMENTS

| | | | | |
|---|---|---|---|---|
| 4,660,833 A | * | 4/1987 | Dickinson et al. | 463/20 |
| 5,454,097 A | * | 9/1995 | Babin | 711/109 |
| 6,052,073 A | * | 4/2000 | Carr et al. | 341/100 |
| 6,473,059 B1 | * | 10/2002 | Yasue | 345/3.1 |
| 7,423,563 B2 | * | 9/2008 | Zucker | 341/100 |
| 7,619,547 B2 | * | 11/2009 | Yamagata et al. | 341/100 |

FOREIGN PATENT DOCUMENTS

CN 2543155 4/2003

* cited by examiner

*Primary Examiner* — Kenneth Kim
(74) *Attorney, Agent, or Firm* — Peter F. Corless; Steven M. Jensen; Edwards Wildman Palmer LLP

(57) ABSTRACT

A control device having an output pin expansion function and an output pin expansion method thereof are provided. The method includes: connecting at least a shift register unit having a plurality of data transmission pins to a control unit such that the shift register unit can receive strobe signals, a multi-bit data stream, clock signals and enable signals generated by the control unit; sending an enable signal by the control unit so as to allow the shift register unit to shift and store each bit of a multi-bit data stream according to a clock signal generated by the control unit; and sending a strobe signal by the control unit so as to allow the shift register unit to output the multi-bit data in parallel format as opposed to the received serial format through the plurality of data transmission pins, thereby allowing a processing device to interface with more devices (such as LED state indicators) than its fixed number of dedicated output pins would conveniently allow, thus saving costs and board space.

7 Claims, 3 Drawing Sheets

OUTPUT PIN EXPANSION USING SHIFT REGISTER RECEIVING DATA BIT EACH SOFTWARE COUNTED CLOCK FOR PARALLEL OUTPUT STROBE

BACKGROUND OF THE INVENTION

1. Field of the Invention

The present invention relates generally to a control device having an output pin expansion function and an output pin expansion method, and more particularly, to a control device that uses a shift register unit for achieving an output pin expansion function and an output expansion method.

2. Description of Related Art

Generally, various functions of electronic devices, such as computer systems, server systems and network devices, are indicated by LEDs that are driven by signals output from general purpose I/O (GPIO) pins of central processing units of the electronic devices. For example, a wireless network router with a wireless internet access function has a plurality of LEDs for indicating the operating state of the wireless internet access, such as indications for sysbooting, sysready, Wlanddisconnect, WlanWpsScan, Wlan11aMode, Wlan11gMode, WlanInactivity, WlanRateLow, WlanRateHigh, WlanRateMid, EthernetActivity and so on. Accordingly, a great number of LEDs need to be disposed in a wireless network router for such indications. However, a wireless network router typically lacks enough GPIO pins for driving so many LEDs.

Consequently, many logic gates and complex circuits are added to printed circuit boards to expand the number of GPIO pins. However, this consumes a lot of space on the printed circuit boards and cannot be applied to products with limited space.

Therefore, there is a need to provide a control device having an output pin expansion function and an output pin expansion method so as to overcome the above drawbacks.

SUMMARY OF THE INVENTION

According to the above drawbacks, the present invention provides a control device having an output pin expansion function and an output pin expansion method so as to expand the number of available output pins using a simplified circuit design that conserves board space and reduces design costs.

In order to achieve the above and other objects, the present invention provides a control device having an output pin expansion function, which comprises: a control unit for generating a strobe signal, a multi-bit data stream, a clock signal and an enable signal, wherein the control unit has first, second, third and fourth output pins for outputting the strobe signal, the multi-bit data stream, the clock signal and the enable signal, respectively; and a shift register unit having a strobe signal pin, a data pin, a clock signal pin, an enable signal pin and a plurality of data transmission pins, wherein the strobe signal pin, the data pin, the clock signal pin and the enable signal pin are connected to the first to fourth output pins of the control unit, respectively, the shift register unit receives the enable signal through the enable signal pin so as to shift and store each bit of the multi-bit data stream received through the data pin according to the clock signal, and further receives the strobe signal through the strobe signal pin so as to output the multi-bit data in parallel through the plurality of data transmission pins.

The control unit accumulates the number of pulses of the clock signal, and generates the strobe signal when the accumulated number of pulses of the clock signal is equal to the number of bits of the multi-bit data stream. Furthermore, the control unit changes the level of the strobe signal so as to enable the shift register unit to output the multi-bit data when the accumulated number of pulses of the clock signal is equal to the number of bits of the multi-bit data stream.

The control device of the present invention comprises two shift register units connected to each other by the data pin or the plurality of data transmission pins therebetween.

The present invention further provides an output pin expansion method for expanding the number of available data output pins of the control unit, which comprises: connecting at least a shift register unit having a plurality of data transmission pins to a control unit such that the shift register unit can receive the strobe, clock and enable signals and the multi-bit data stream, generated by the control unit; sending an enable signal by the control unit so as to allow the shift register unit to shift and store each bit of the multi-bit data stream according to a clock signal generated by the control unit; and sending a strobe signal by the control unit so as to allow the shift register unit to output the multi-bit data in parallel through the plurality of data transmission pins.

Compared with the prior art that use a lot of logic gates and complex circuits to achieve output pin expansion, the present invention expands an output pin of a control unit to a plurality of output pins through a combination of software programs and at least a shift register unit, thereby simplifying the circuit structure, saving circuit board space and costs.

DETAILED DESCRIPTION OF PREFERRED EMBODIMENTS

The following illustrative embodiments are provided to illustrate the disclosure of the present invention, these and other advantages and effects being readily apparent to those skilled in the art after reading the disclosure of this specification.

The control device having an output pin expansion function according to the present invention comprises a control unit and a shift register unit. In the present embodiment, two shift register units are exemplified for illustration purposes, but this number is not intended to limit the present invention. The number of shift register units can be determined according to the desired expansion number of output pins of the control device.

Figure 1:
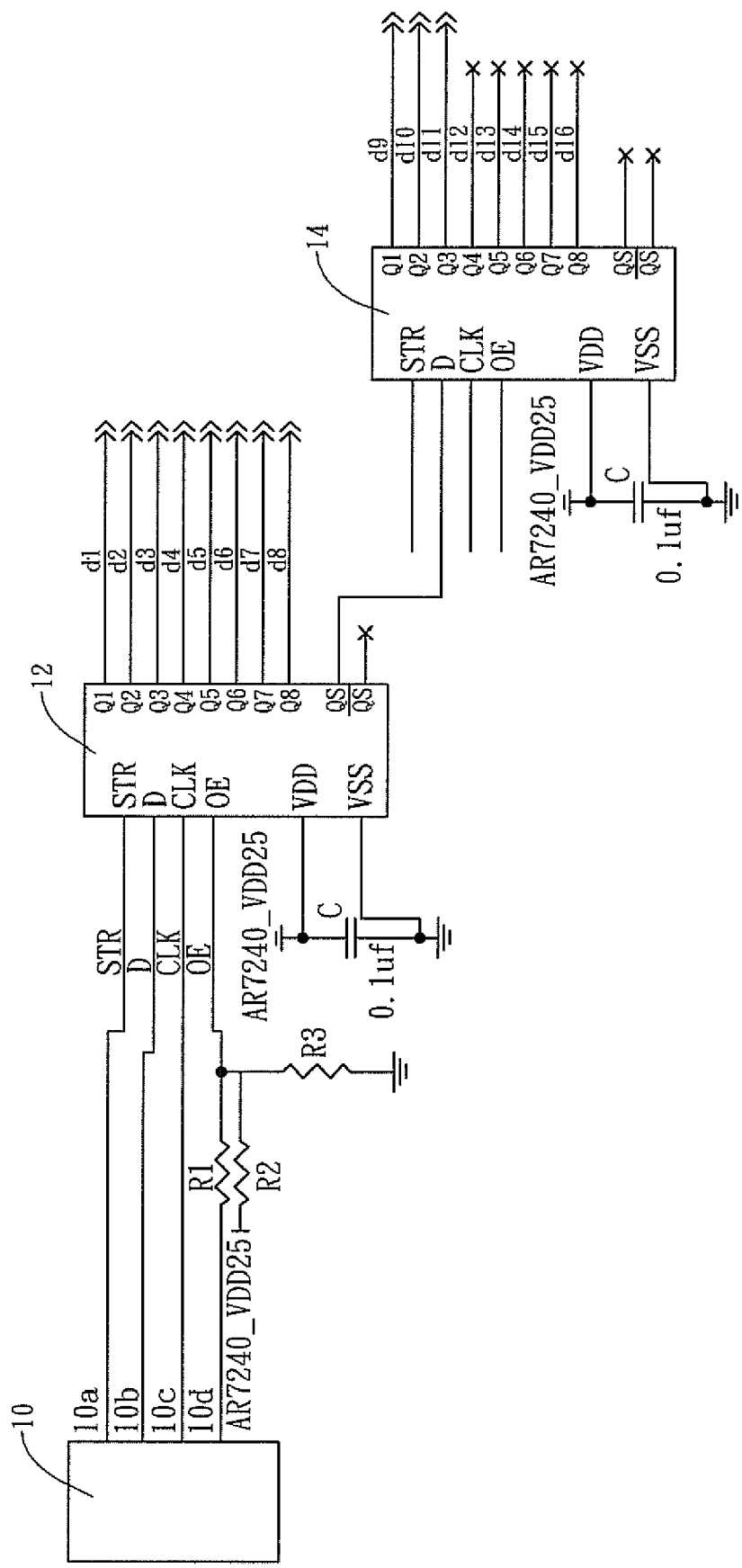
FIG. 1 is a circuit diagram of a control device having an output pin expansion function according to the present invention.

FIG. 1 is a circuit diagram of a control device having an output pin expansion function according to the present invention. As shown in the drawing, the control device comprises a control unit 10 and shift register units 12, 14.

The control unit 10 has output pins 10a, 10b, 10c and 10d. The control unit 10 achieves output pin expansion by using the shift register units 12, 14 and software programs (not shown). Therein, the software programs can be established inside a memory (not shown) of the control unit 10 or stored in an external storage medium (not shown). The software programs are used for generating a strobe signal STR, a multi-bit data stream D, a clock signal CLK and an enable signal OE, which are output through the output pins 10a, 10b, 10c and 10d, respectively. In the present embodiment, the control unit 10 is a CPU (central processing unit), and the output pins 10a to 10d are GPIO pins of the CPU.

In the present embodiment, the shift register units 12, 14 are exemplified by the 74HC4049 chip. As shown in FIG. 1, each of the shift register units 12, 14 has a strobe signal (STR) pin, a data (D) pin, a clock signal (CLK) pin, an enable signal (OE) pin and a plurality of data output transmission pins Q1, Q2, . . . Q8, Qs, $\overline{QS}$. The data output transmission pins Q1, Q2, . . . Q8, Qs, $\overline{QS}$ are used as expansion output pins of the control unit. The STR pin, CLK pin, OE pin of the shift register units 12, 14 are connected to the output pins 10a, 10c and 10d of the control unit 10, respectively, for receiving the strobe signal STR, the clock signal CLK and the enable signal OE from the control unit 10, respectively. The D pin of the shift register unit 12 is connected to the output pin 10b of the control unit 10 for receiving the multi-bit data stream D. The D pin of the shift register unit 14 is connected to the QS pin of the shift register unit 12. Given the series connection of the shift register units 12, 14, the original four output pins 10a, 10b, 10c, and 10d of the control unit 10 are expanded to sixteen output pins (output pins d1, d2, d3, d4, d5, d6, d7, and d8 of shift register unit 12, and output pins d9, d10, d11, d12, d13, d14, d15, and d16 of shift register unit 14).

The VDD pin of each of the shift register units 12, 14 is connected to the power AR7420_VDD25. The VDD pin is filtered by means of a capacitor C with a capacitance of 0.1 μF. The VSS pin of each of the shift register units 12, 14 is grounded. A resistor R1 is connected between the output pin 10d of the control unit 10 and the OE pin of shift register unit 12. The shift register-connected end of resistor R1 is also connected to power (AR7420_VDD25) via a resistor R2 and connected to ground via a resistor R3.

The shift register unit 12 provides eight data output transmission pins Q1 to Q8 as output pins d1 to d8. The shift register unit 14 provides three data output transmission pins Q1 to Q3 as output pins d9 to d11. The other data output transmission pins Q4 to Q8 of shift register unit 14 are floated (not connected). In this particular embodiment, the control unit 10 outputs a serial stream of 11 bits of data on output pin 10b. The 11-bit data $d_1 d_2 \ldots d_{11}$ output by the output pin 10b of the control unit 10 is ultimately output in parallel through the data transmission pins Q1 to Q8 of the shift register unit 12 and pins Q1 to Q3 of the shift register unit 14.

Figure 2:
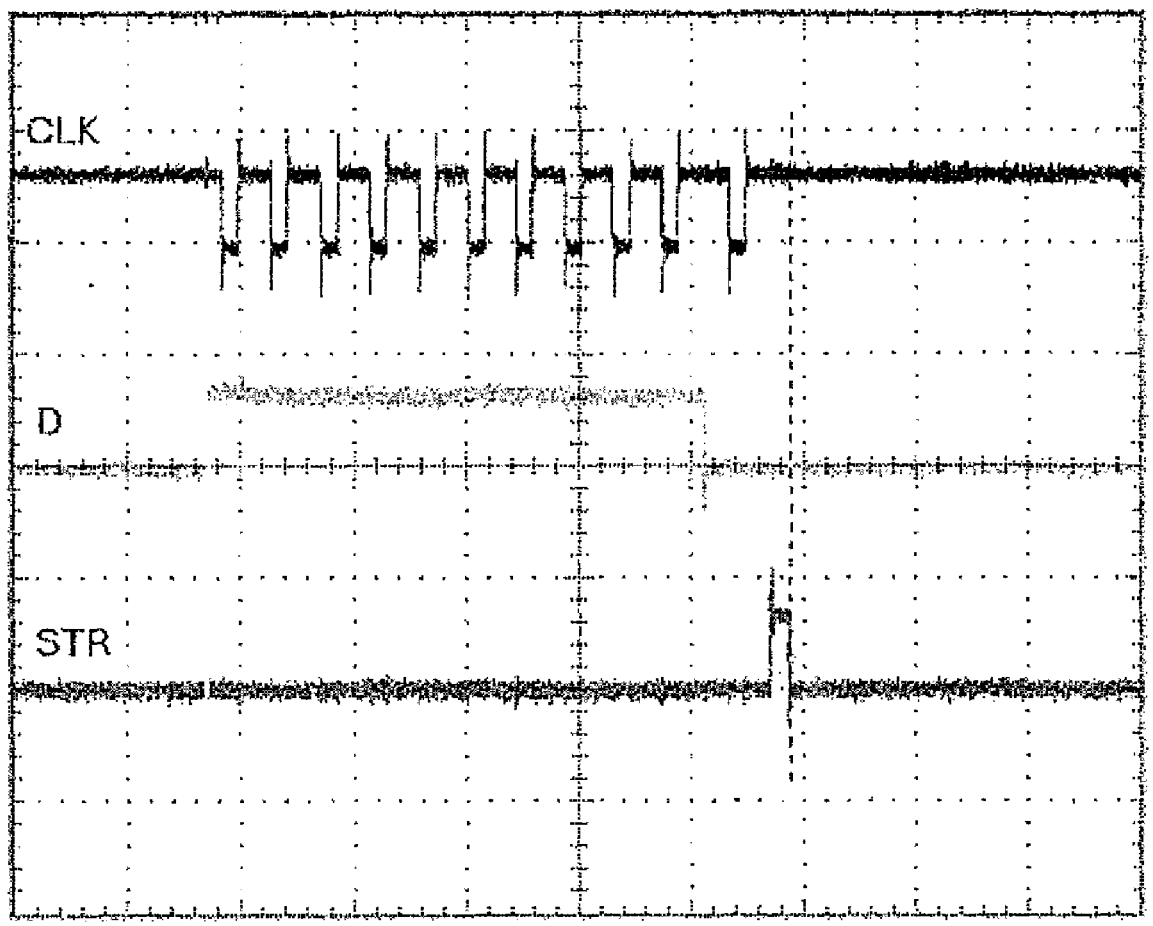
FIG. 2 is a timing diagram showing waveforms for the strobe signal STR, multi-bit data stream D and a clock signal CLK generated by the control device through software programs.

FIG. 2 is a timing diagram showing waveforms for the strobe signal STR, the multi-bit data stream D and the clock signal CLK generated by the control device having an output pin expansion function. In the present embodiment, the control unit 10 reads the software programs to generate the strobe signal STR, the multi-bit data stream D and the clock signal CLK and further outputs them through the output pins 10a, 10b and 10c, respectively. As shown in FIG. 2, the clock signal CLK has 11 pulses. During said 11 pulses, the strobe signal STR is always at a low level, thereby keeping the STR pin of each shift register unit 12, 14 in a disabled state all the time so as to prevent the data transmission pins Q1, Q2, . . . Q8, Qs, $\overline{QS}$ of each of the shift register units 12, 14 from transmitting new data. The control unit 10 generates an enable signal OE according to the software programs and outputs the enable signal OE through the output pin 10d, thereby keeping the shift register units 12, 14 at an enabled state. The shift register units 12, 14 shift and store each bit of the multi-bit data stream according to the received clock signal CLK. Meanwhile, the software programs count the number of pulses of the clock signal CLK generated by the control device 10 and received by the shift register units 12, 14. A high level strobe signal STR is generated when the count reaches 11, so as to switch the STR pins of the shift register units 12, 14 to an enabled state, thereby outputting the 11-bit data d1, d2, d3, d4, d5, d6, d7, d8, d9, d10, and d11 via the data transmission pins Q1 to Q8 of shift register unit 12 and the data transmission pins Q1 to Q3 of shift register unit 14. Since the shift processing and parallel output technique of the shift register units 12, 14 are well known in the art, detailed description thereof is omitted.

It should be noted that the shift register units of the present invention are not limited to the 74HC4049 chip. In practice, other electronic elements having similar functions can be used. Further, the number of the electronic elements can be determined according to the required expansion output pins and is not limited to the series connected two shift register units in FIG. 1.

Figure 3:
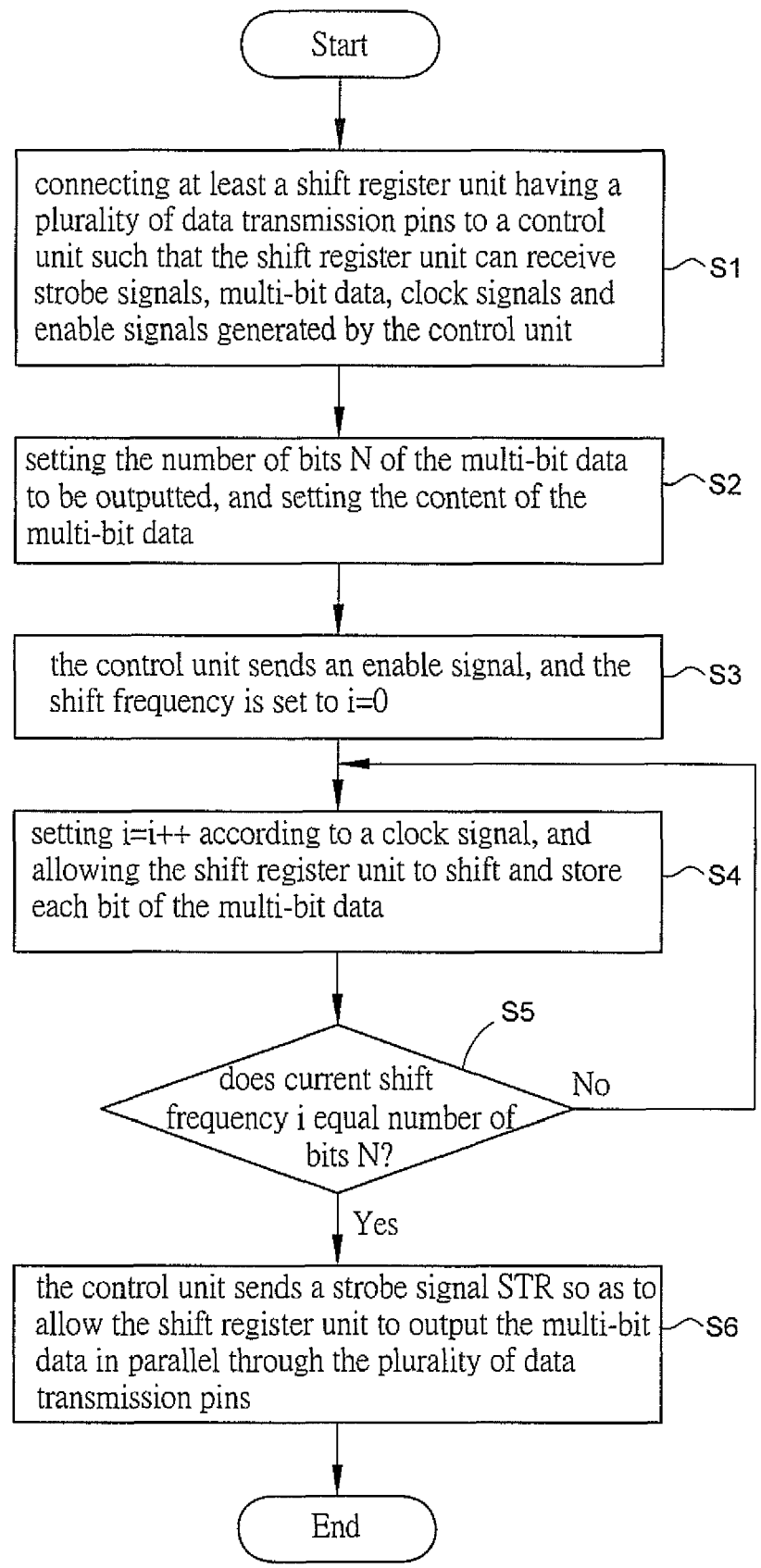
FIG. 3 is a flow diagram showing an output pin expansion method according to an embodiment of the present invention.

FIG. 3 shows a flow diagram of an output pin expansion method according to an embodiment of the present invention. The output pin expansion method is used for expanding output pins of a control unit. As shown in the drawing, first at step S1, at least a shift register unit having a plurality of data transmission pins is connected to the control unit so as to receive strobe signals, multiple-bit data, clock signals and enable signals generated by the control unit. Then, the process goes to step S2.

At step S2, the number of bits N of the multi-bit data stream to be output by the control unit is set and the content of the multi-bit data stream is set. In the present embodiment, the number of bits N is equal to the number of data output pins. Then, the process goes to step S3.

At step S3, the control unit sends an enable signal and the shift count is set to i=0, thereby starting the multi-bit data output operation. Then, the process goes to step S4.

At step S4, according to a clock signal, the control unit increments the count i=i++ for recording and updating the shift count, and allows the shift register unit to shift in and store each bit of the multi-bit data stream. That is, each time a clock pulse is generated, each bit of the multi-bit stream to be output is shifted and stored. Then, the process goes to step S5.

At step S5, the control unit determines whether the shift count i is equal to the number of bits N of the multi-bit data stream, wherein, if it is, the process goes to step S6, otherwise, the process goes back to step S4 so as to shift and store each bit of the multi-bit data stream until the last bit of the multi-bit data stream is shifted and stored.

At step S6, when the control unit determines that the last bit of the multi-bit data stream is shifted and stored by the shift register unit (that is, the shift count i is equal to the number of bits N), a strobe signal STR is sent so as to allow the shift register units to output the multi-bit data in parallel via the plurality of data output transmission pins.

It should be noted that the output pin expansion method of the present invention is not limited to the above-described steps, that is, not limited to the above-described setting method of variables N and i and the associated logic method. In other words, various setting and logic methods can be applied, provided that they allow the shift register unit to output the multi-bit data in parallel after the last bit is shifted and stored by the shift register unit.

Therefore, compared with the prior art that use a lot of logic gates and complex circuits to achieve output pin expansion, the present invention expands output pins of a control unit through a combination of software programs and at least a shift register unit, thereby simplifying the circuit structure, saving circuit board space and costs.

The above-described descriptions of the detailed embodiments are provided to illustrate the preferred implementation according to the present invention, and they are not intended to limit the scope of the present invention. Accordingly, various modifications and variations completed by those with ordinary skill in the art fall within the scope of present invention as defined by the appended claims.

What is claimed is:

1. A control device having an output pin expansion function, comprising:
    a control unit for generating a strobe signal, a multi-bit data stream, a clock signal and an enable signal, wherein the control unit has first, second, third, and fourth output pins for outputting the strobe signal, the multi-bit data stream, the clock signal and the enable signal, respectively;
    a shift register unit having a strobe signal input pin, a data input pin, a clock signal input pin, an enable signal input pin, and a plurality of data output transmission pins to output multi-bit data derived from the multi-bit data stream, wherein the strobe signal input pin, the data input pin, the clock signal input pin, and the enable signal input pin are connected to the first to fourth output pins of the control unit, respectively, and the shift register unit receives the enable signal through the enable signal input pin so as to shift and store each bit of the multi-bit data stream received through the data input pin according to the clock signal, and further receives the strobe signal through the strobe signal input pin so as to output the multi-bit data stream in parallel through the plurality of data transmission pins;
    a memory connected to the control unit; and
    software programs stored in the memory for controlling the control unit,
    wherein the software program counts a number of pulses of the clock signal received by the shift register unit, and the control unit generates the strobe signal when the count of said number of pulses of the clock signal is equal to a predetermined number of bits of the multi-bit data stream, and wherein the control unit changes a level of the strobe signal so as to enable the shift register unit to output the multi-bit data when the count of said number of pulses of the clock signal is equal to the predetermined number of bits of the multi-bit data stream.

2. The device of claim 1 further comprising two shift register units cascaded together by one of the plurality of data output transmission pins.

3. The device of claim 1, wherein the control unit is a central processing unit.

4. The device of claim 1, wherein the software programs further control the shift register unit.

5. The device of claim 1, wherein the memory is disposed in the control unit.

6. The device of claim 1, wherein the memory is disposed outside the control unit.

7. An output pin expansion method for expanding data output pins of a control unit, comprising:
    connecting at least a shift register unit having a plurality of data output transmission pins to a control unit such that the shift register unit can receive strobe signals, a multi-bit data stream, clock signals and enable signals generated by the control unit;
    sending an enable signal by the control unit so as to allow the shift register unit to shift and store each bit of a multi-bit data stream according to a clock signal generated by the control unit; and
    sending a strobe signal by the control unit so as to allow the shift register unit to output multi-bit data derived from the multi-bit data stream in parallel through the plurality of data output transmission pins,
    wherein after having sent the enable signal, the software programs count a number of pulses of the clock signal received by the shift register unit and the control unit generates the strobe signal when the count of said number of pulses of the clock signal is equal to a predetermined number of bits of the multi-bit data stream, and wherein the control unit changes a level of the strobe signal so as to enable the shift register unit to output the multi-bit data when the count of said number of pulses of the clock signal is equal to the predetermined number of bits of the multi-bit data.

* * * * *